United States Patent [19]
Maeda et al.

[11] Patent Number: 5,589,001
[45] Date of Patent: Dec. 31, 1996

[54] APPARATUS FOR FORMING A FILM ON A WAFER

[75] Inventors: Kazuo Maeda; Kouichi Ohira; Hiroshi Chino, all of Tokyo, Japan

[73] Assignees: Canon Sales Co., Inc.; Alcan-Tech Co., Inc.; Semiconductor Process Laboratory Co., Ltd., all of, Japan

[21] Appl. No.: 159,127

[22] Filed: Nov. 30, 1993

[30] Foreign Application Priority Data

Nov. 30, 1992 [JP] Japan .................................. 4-320504

[51] Int. Cl.⁶ .................................................. C23C 16/00
[52] U.S. Cl. ........................................ 118/722; 118/730
[58] Field of Search .............................. 156/345; 118/715, 118/722, 730

[56] References Cited

U.S. PATENT DOCUMENTS

| | | | |
|---|---|---|---|
| 4,715,921 | 12/1987 | Maher et al. | 156/345 |
| 5,013,385 | 5/1991 | Maher et al. | 156/345 |
| 5,330,577 | 7/1994 | Maeda et al. | 118/722 |

FOREIGN PATENT DOCUMENTS

| | | |
|---|---|---|
| 0526644 | 2/1993 | European Pat. Off. . |
| 6124891 | 5/1994 | Japan . |

Primary Examiner—John Niebling
Assistant Examiner—Brian K. Dutton
Attorney, Agent, or Firm—Lorusso & Loud

[57] ABSTRACT

An apparatus for forming a film by the CVD method allows reaction products to be easily removed from a gas discharge surface without decreasing the uptime/downtime ratio, and includes a gas distributor having a gas discharge surface for discharge of a reaction gas for forming a film on a substrate. A wafer holder has a wafer mounting surface facing the gas discharge surface. A cleaner has a suction head and a brush formed at the entrance of the suction head. A rotary shaft supports the cleaner for movement between the gas discharge surface and a stand-by position and brings the brush of the cleaner onto the gas discharge surface. A vertical positioner moves the wafer holder or gas distributor upward or downward, whereby the wafer holder approaches the gas discharge surface for forming a film and is spaced from the gas discharge surface when cleaning the gas discharge surface by movement of the cleaner on the gas discharge surface.

8 Claims, 6 Drawing Sheets

APPARATUS FOR FORMING A FILM ON A WAFER

BACKGROUND OF THE INVENTION

1. Field of the Invention

The present invention relates to an apparatus for forming a film, particularly to an apparatus for forming a film by the CVD method.

2. Description of the Related Art

There are various types of CVD apparatus for forming a film. With every CVD apparatus, the chemical reaction of a reaction gas is used for forming a film and, therefore, reaction products stick to the gas discharge surface of the gas distributor. These reaction products come off as particles and stick to the wafer, contaminating the wafer. To prevent the particles from sticking onto the wafer, it is necessary to regularly clean the gas discharge surface of the gas distributor of the CVD apparatus.

CVD apparatus of the plasma assisted type has the capability of reducing pressure in the chamber and of introducing an etching gas into the chamber at reduced pressure. Therefore, when reaction products stick to the gas discharge surface of such a gas distributor, it is possible to easily remove the reaction products from the gas discharge surface by introducing etching gas. This method is called in-situ cleaning and is used in practice.

An atmospheric pressure CVD apparatus using, for example, a reaction gas such as a $SiH_4$—$O_2$ mixed gas or a $TEOS$-$O_3$ mixed gas, however, because the apparatus does not normally have the capability of reducing the pressure in the chamber, when the reaction products stick to a gas discharge surface as powder particles, it is impossible to perform the in-situ cleaning as with the plasma assisted CVD apparatus. In such a case, the reaction products are physically removed by a cleaner or the like, or they are chemically removed by exposing the gas discharge surface to chemicals such as hydrofluoric acid (HF), after stopping the operation of the CVD apparatus and opening the chamber. Therefore, for the atmospheric pressure CVD apparatus, cleaning requires a lot of time and labor and this decreases the uptime/downtime ratio for the apparatus. Moreover, when the quantity of accumulated reaction products greatly increases, it becomes difficult to remove.

SUMMARY OF THE INVENTION

It is an object of the present invention to provide an apparatus for forming a film while allowing reaction products to be easily removed from a gas discharge surface without decreasing the uptime/downtime ratio of the apparatus.

The apparatus for forming a film of the present invention has a cleaner including a suction device and a brush connected to the suction device. The cleaner is supported by a rotary shaft and, upon being rotated around the rotary shaft, moves between a working position at a gas discharge surface and a standby positions removed from the gas discharge surface. In a working position the brush of the cleaner is in contact with a gas discharge surface.

Therefore, before or after forming a film, by brushing the gas discharge surface with evacuation of the loosened dust through the suction port, it is possible to keep the gas discharge surface clean, to prevent dust from scattering in the chamber, and to thus keep high cleanliness in the chamber.

The cleaner is mechanically separated from the wafer holder and the gas distributor. Therefore, it is possible to leave the cleaner undisturbed when detaching the wafer holder or gas distributor for cleaning or repair and, on the other hand, it is possible to leave the wafer holder and gas distributor undisturbed when detaching the cleaner. Therefore, maintenance of the apparatus can easily be performed.

Moreover, because the cleaner is provided in the chamber, it is possible to easily remove dust from the chamber without opening the chamber. Therefore, because it is unnecessary to stop the apparatus to clean the chamber as with the conventional apparatus, is possible to prevent the uptime/downtime ratio of the apparatus from decreasing.

Furthermore, because the cleaner is set in the chamber containing the gas distributor and wafer holder supported by a rotary shaft, it is possible to provide an automated and continuous type of CVD apparatus with the capability of keeping the chamber clean at all times.

Furthermore, as the wafer holder is supported by the rotary shaft and the cleaner is secured to the wafer holder, it is possible to move the cleaner onto each gas discharger of the gas distributor in succession by rotating the wafer holder.

BRIEF DESCRIPTION OF THE DRAWINGS

FIG. 1A to FIG. 1C are schematic illustrations of the cleaner for CVD apparatus of an embodiment of the present invention, in which FIG. 1A is a top view showing a state in which the cleaner is in contact with a gas discharger of the gas distributor, FIG. 1B is a side view showing formation of a film on a wafer, and FIG. 1C is a side view showing the state in which the cleaner is in contact with a gas discharger;

FIG. 6A to FIG. 6C are schematic top views showing steps in a semiconductor device manufacturing method using the CVD apparatus of the present invention, in which FIG. 6A is a top view illustrating formation of a film on a wafer in one rotation of the wafer holder around the rotary shaft, FIG. 6B is a top view showing a wafer mounted on every susceptor for simultaneously forming a film on every wafer using one type of reaction gas, and FIG. 6C is a top view showing formation of a multilayer film comprising two types of films on one wafer by using two types of reaction gases.

DESCRIPTION OF THE PREFERRED EMBODIMENT (1) Construction of the CVD apparatus The construction of the CVD apparatus of an embodiment of the present invention is described below by referring to FIG. 2 to FIG. 4.

Figure 2:
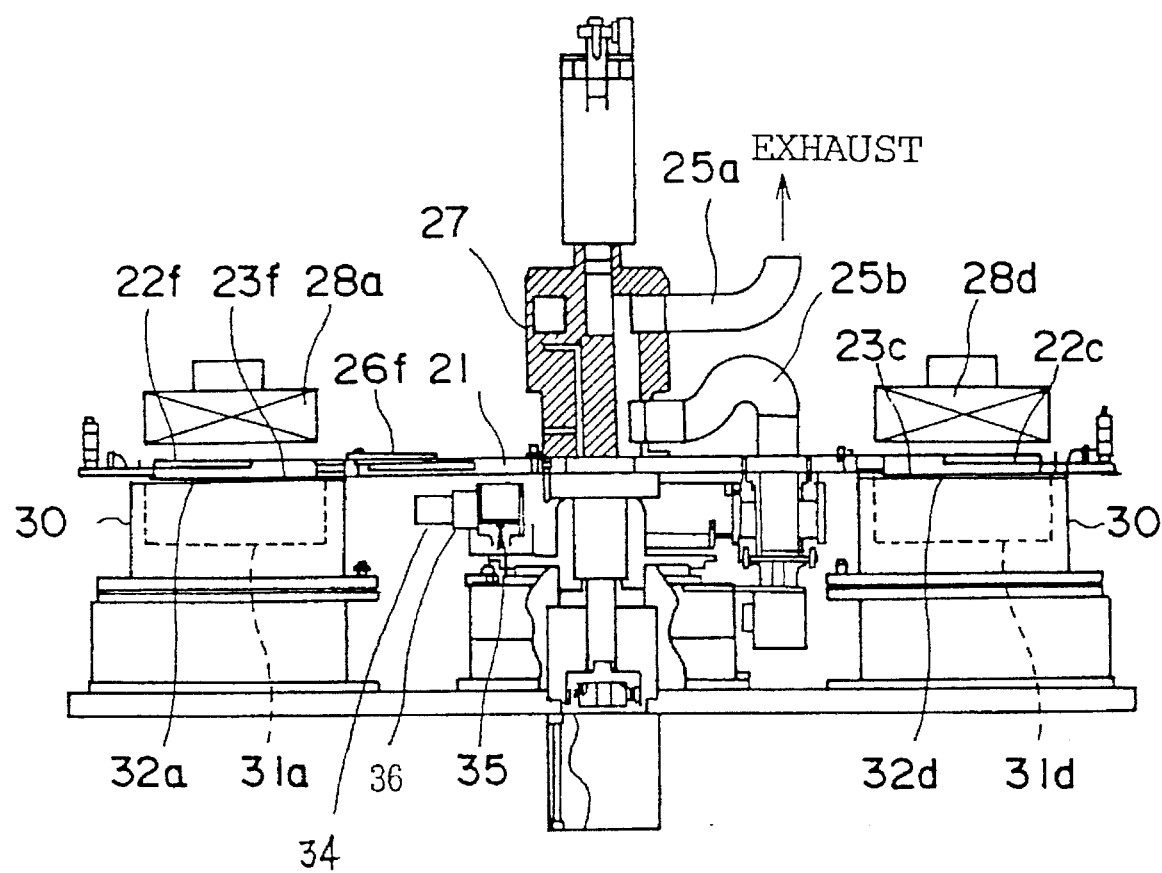
FIG. 2 is a side view of a CVD apparatus equipped with the cleaner of the present invention.
Figure 3:
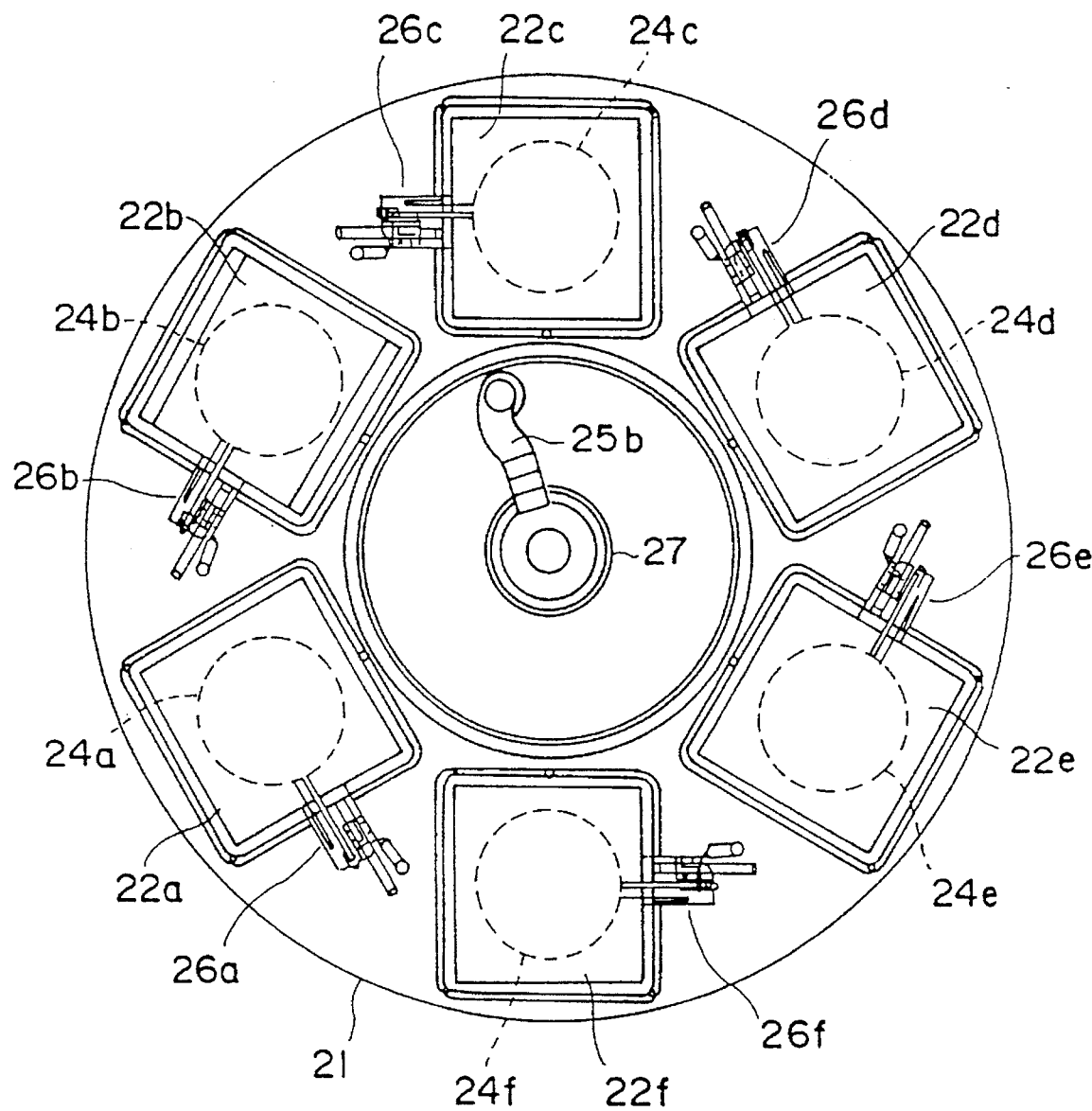
FIG. 3 is a top view showing the details of the wafer holder of the CVD apparatus of the present invention.

In FIG. 2 and FIG. 3, symbol 21 is a discoid wafer holder. Six detachable susceptors 22a to 22f are set along the circumference of the disk at equal intervals. The susceptors 22a to 22f are made of stainless steel and have a large heat capacity so that, once the temperature of the susceptors 22a to 22f is raised by the heaters, it does not easily lower. Wafer mounting surfaces 23a to 23f of the susceptors 22a to 22f are turned downward so that wafers 24a to 24f mounted on the wafer mounting surfaces 23a to 23f face gas dischargers 32a to 32e of a gas distributor 30.

A pipe 25b is connected to the wafer holder 21 so that the wafers 24a to 24f are secured to the wafer mounting surfaces 23a to 23f by suction through the pipe 25b and gas exhaust/introduction port 25. Nitrogen gas is introduced through the pipe 25b and gas exhaust/introduction port 25a to detach the wafers from the wafer mounting surfaces 23a to 23f.

An oscillation unit (not-illustrated) is provided for each of the susceptors 22a to 22f, respectively, to rotate or linearly move each of them in the radial direction around a vertical shaft.

Thermocouples 26a to 26f (temperature measuring means) are detachable from the susceptors 22a to 22f. FIG. 2 and FIG. 3 show the mounting of the thermocouples 26a to 26f for measurement of the temperatures of the wafers 24a to 24f.

A rotary shaft 27 supports the wafer holder 21. The wafer holder 21 rotates around the rotary shaft 27 as a moving surface between gas dischargers 31a to 31e and heaters 28a to 28f, while holding the wafers 24a to 24f.

Moreover, the rotary shaft 27 is vertically movable and the wafer holder 21 is also vertically moved with the rotary shaft 27. When cleaning any of the gas discharge surfaces 32a to 32e, the wafer holder 21 is moved upward to space the wafer holder 21 from the gas distributor 30, thereby providing room for movement of cleaner 34.

Heaters 28a and 28d (heating instruments) face the susceptors 22c and 22f of the wafer holder 21. FIG. 2 shows only the heaters 28a and 28d of those facing the susceptors 22a to 22f. The heaters 28a to 28f are separated from each other so that they can independently supply electric power. They heat the susceptors 22a to 22f from the opposite side of the wafer mounting surfaces 23a to 23f by heat radiation and heat conduction and the temperature of the susceptors 22a to 22f is raised to indirectly heat the wafers 24a to 24f.

Each of the heaters rotates about a rotary shaft (not-illustrated) parallel to the wafer mounting surfaces 23a to 23f of the susceptors 22a to 22f. Therefore, each of the susceptors 22a to 22f can easily be detached by providing space by rotation of the heaters upward.

Figure 4:
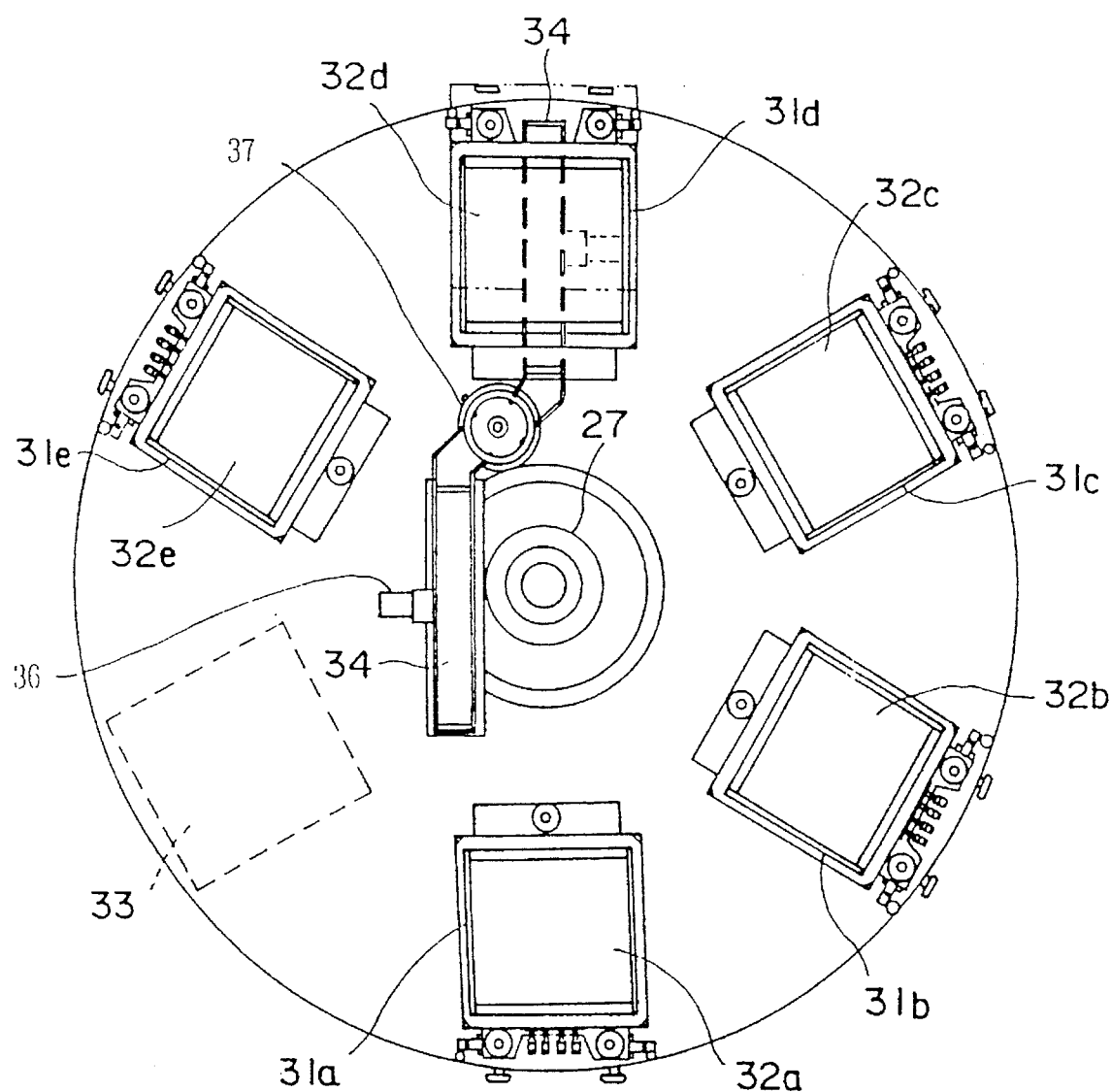
FIG. 4 is a top view showing details of the gas distributor and cleaner of the CVD apparatus of the present invention.

As shown in FIG. 2 and FIG. 4, a gas distributor 30 which supplies a reaction gas onto the wafers 24a to 24f, and which includes gas dischargers 31a to 31e arranged spaced from each other in a circle around the rotary shaft 27, occupies five positions at intervals corresponding to the positions of susceptors 22a to 22f. There is one position where there is no gas discharger, which serves as a loading/unloading position 33.

Spent and excess reaction gas is exhausted through an exhaust port around each of the gas dischargers 31a to 31e.

The gas discharge surfaces 32a to 32e of the gas dischargers 31a to 31e are turned upward so as to face the wafer mounting surfaces 23a to 23f of the susceptors 22a to 22f.

A cleaner 34 serves to remove reaction products sticking to the gas discharge surfaces 32a to 32e. The cleaner 34 is supported by a rotary shaft 37. The rotary shaft 37 is rotated to move cleaner 34 to a standby position close to the rotary shaft 27 of the wafer holder 21 when it is not in use and to move it onto one of the gas discharge surfaces 32a to 32e when it is used. The rotary shaft is formed integrally with the wafer holder 21 and the cleaner 34 rotates together with the wafer holder 21.

Figure 1A:
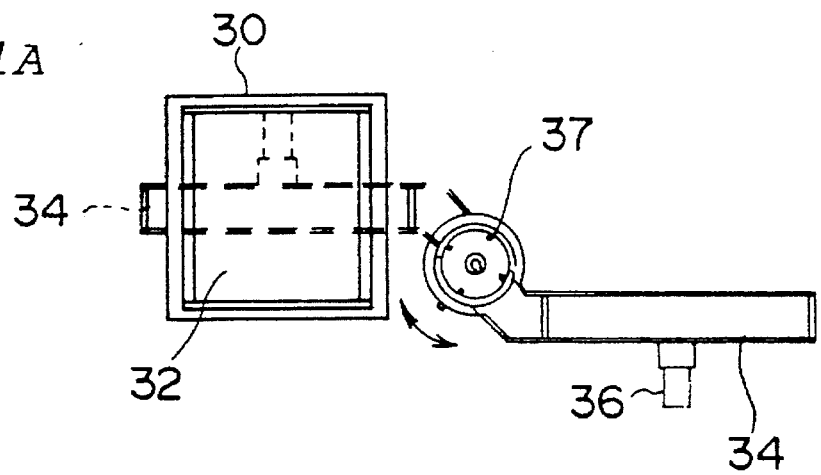
Figure 1B:
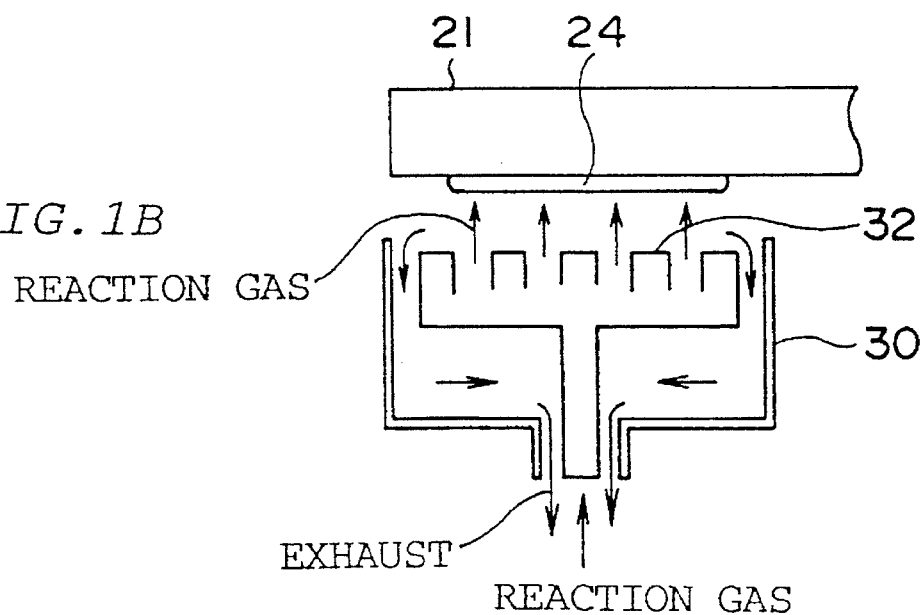
Figure 1C:
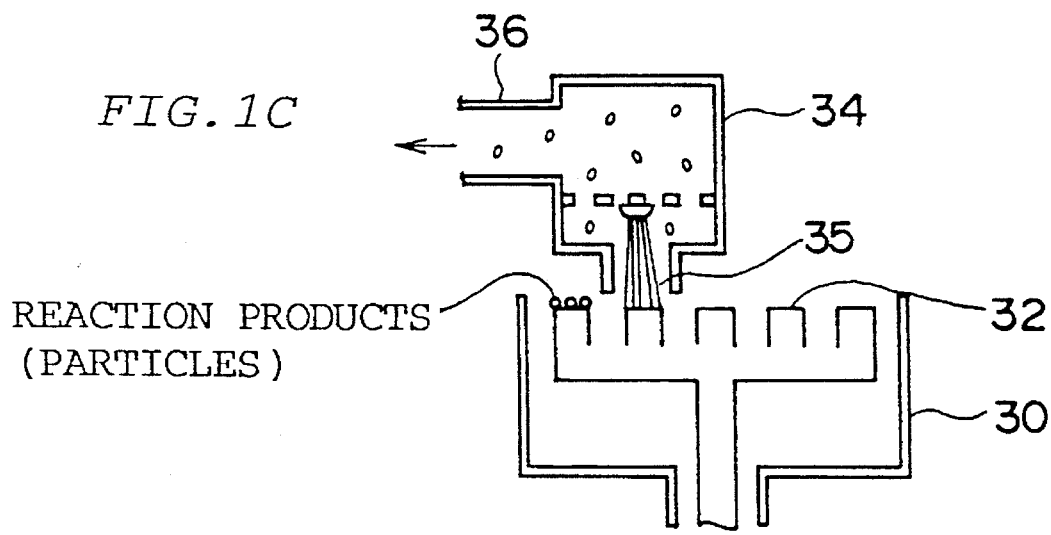

Moreover, as shown in FIG. 1C in detail, the cleaner 34 has a brush 35 which protrudes from a surface of a slender angular vessel and which faces and contacts the gas discharge surfaces 32a to 32e. Furthermore, the surface mounting the brush 35 has an opening which connects with a suction port 36 provided at the side of the vessel. The suction port 36 connects with a exhauster (not-illustrated) and by exhausting gas immediately draws in dust having been loosened from a gas discharge surface 32a to 32e by brushing with the brush 35.

Figure 5:
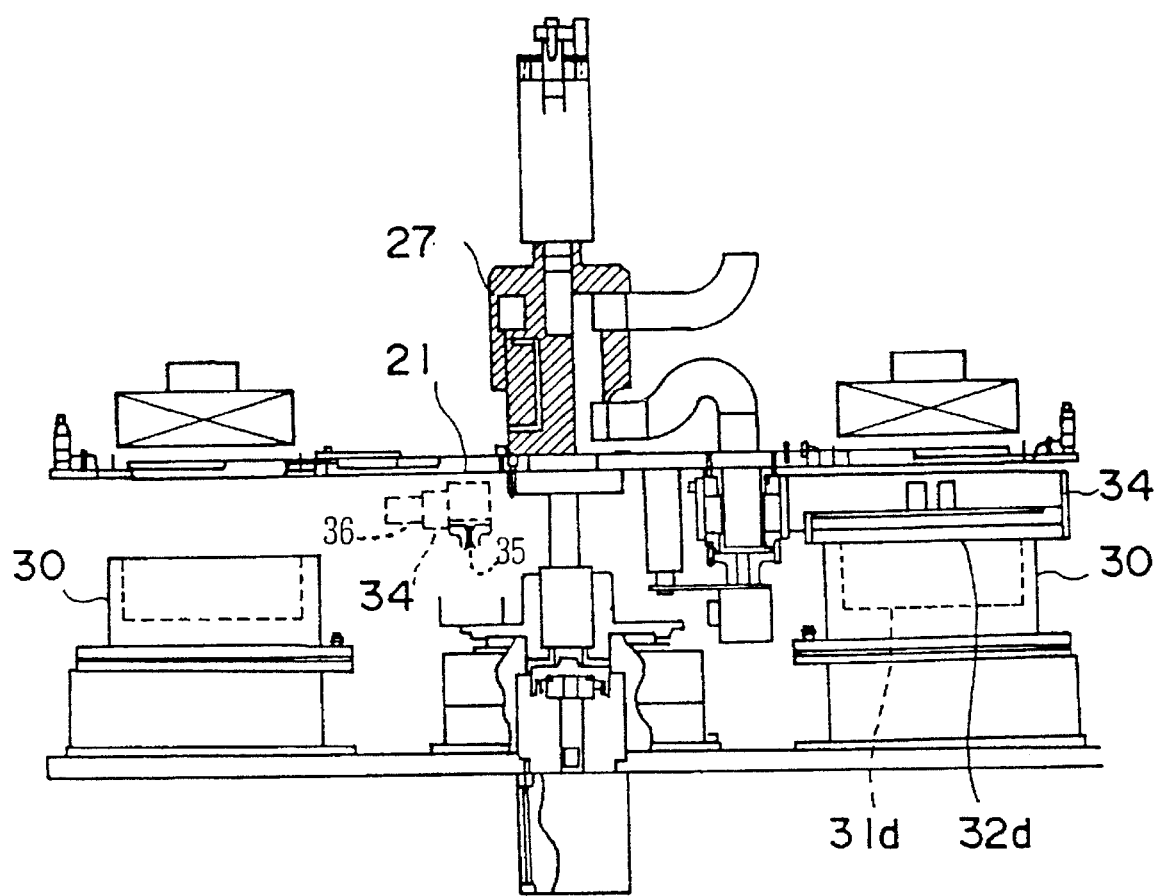
FIG. 5 is a side view illustrating operation of the CVD apparatus of the present invention.

For cleaning the gas discharge surfaces 32a to 32e, after forming a film on a wafer with the wafer holder 21 positioned near the gas discharge surfaces 32a to 32e of the gas distributor 30 as shown in FIG. 1B, the wafer holder 21 is moved upward by raising the rotary shaft 27 so that an increased space is provided between the wafer holder 21 and the gas distributor 30. Accordingly, the cleaner 34 is not obstructed by the gas distributor 30, i.e., not prevented from rotating as shown in FIG. 5. Then, the cleaner 34 is moved onto the gas discharge surfaces 32a to 32e and contacts and rubs them with the brush 35.

As described above, the CVD apparatus of the present embodiment has a cleaner 34 comprising the suction port 36 and the brush 35 formed at the entrance of the suction port 36. The cleaner 34 is supported by the rotary shaft 37 for pivoting movement between stand-by and working positions.

Therefore, by brushing the gas discharge surfaces 32a to 32e with the brush 35 while exhausting gas through the suction port 36 by the exhauster, it is possible to detach reaction products and draw in the dust through the suction port 36 before or after forming a film. The gas discharge surfaces 32a to 32e are thereby kept clean and the dust is prevented from scattering in the chamber, whereby a higher cleanliness in the chamber is realized.

The cleaner 34 is mechanically separated from the wafer holder 21 and gas distributor 30. Therefore, it is possible to leave the cleaner 34 undisturbed when separating the susceptors 22a to 22f or gas dischargers 31a to 31e for cleaning or repair and it is also possible to leave the susceptors 22a to 22f or gas dischargers 31a to 31e undisturbed when separating the cleaner 34. Thereby, maintenance of the apparatus can easily be performed.

Moreover, the cleaner 34 is set in the chamber housing the gas distributor 30 and the wafer holder 21. Therefore, it is possible to provide an automated and continuous type of a CVD apparatus capable of keeping the chamber clean at all times. Moreover, because the wafer holder 21 is formed integrally with the rotary shaft 37, it is possible to move the cleaner 34 onto all the gas dischargers 31a to 31e by rotation of the wafer holder 21.

While in the above-described embodiment, the wafer holder 21 is supported by the rotary shaft 27 and rotated, it is also possible to fix the wafer holder 21 and support the gas distributor 30 for rotation by the rotary shaft 27. In this case, a space for rotating the cleaner 34 is cleared by moving the rotary shaft 27 downward.

The gas distributor 30 is positioned under the wafer holder 21 and the heaters 28a and 28d are positioned above the holder, and a film is formed on the deposition surface of a wafer facing downward.

It is also possible to form a film on a wafer deposition surface facing upward by positioning the gas distributor above the wafer holder and the heaters below the wafer holder.

Though the wafer holder 21 is separated from the heaters 28a and 28d in the above embodiment, it is possible to form the holder integrally with the heaters.

(2) Description of method of cleaning the gas dischargers

A method for cleaning the gas dischargers 31a to 31e with the cleaner 34 is described below with reference to FIG. 1A to FIG. 1C, FIG. 4 and FIG. 5.

When forming a film on a wafer by the CVD method, reaction products stick to the gas discharge surfaces 32a to 32e of the gas distributors. If left as formed, they come off as particles which will stick to a wafer to prevent patterning or cause a film to abnormally form. Therefore, it is necessary to regularly clean the gas discharge surfaces 32a to 32e of the gas dischargers 31a to 31e by using the cleaner 34.

When cleaning the gas discharge surfaces 32a to 32e of the gas dischargers 31a to 31e by using the cleaner 34, the rotary shaft 27, which supports the wafer holder 21, is moved upward to clear a space in which the cleaner 34 can move between the wafer holder 21 and gas dischargers 31a to 31e as shown in FIG. 5, and then the cleaner 34, positioned close to the rotary shaft 27, is rotated clockwise around the rotary shaft 37 to move the cleaner onto the gas discharge surface 32d and to bring the brush 35 into contact with the gas discharge surface 32d as shown in FIG. 1A and FIG. 4.

After cleaning the gas discharge surface 32d, the cleaner is reciprocated right and left so as to cover the whole gas discharge surface 32d while exhausting gas through the suction port. As shown in FIG. 1C, reaction products are thereby removed by the brush 35, drawn in by the cleaner 34 without scattering and discharged to the exterior of the CVD apparatus.

Then, the rotary shaft 27 is rotated to move the cleaner 34 and thereafter the gas discharge surface 32c is cleaned in the same way as the above. Thus, remaining gas discharge surfaces 32b, 32a, and 32e are successively cleaned.

Moreover, because the cleaner 34 is provided in the chamber, it is possible to easily remove dust from the chamber without opening the chamber. Therefore, because it is unnecessary to stop operation of the apparatus, it is possible to maintain a higher uptime/downtime ratio than with the pre-existing technology.

Figure 6C:
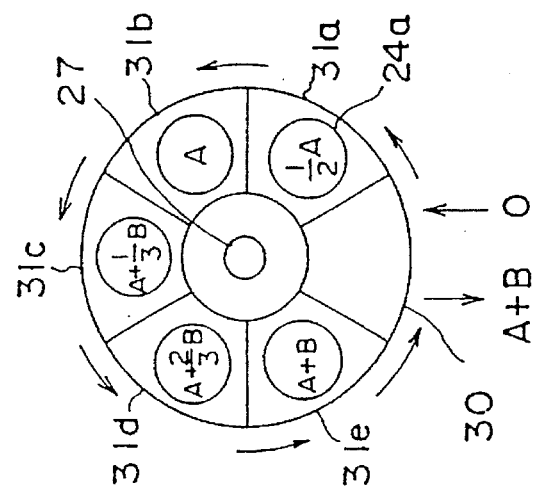

(3) Description of the method for forming film using the CVD apparatus of the present invention A method for forming a two-layer insulating film on a wafer, using the CVD apparatus having the gas distributor 30 and wafer holder 21 shown in FIG. 2, are described below with reference to FIG. 2 to FIG. 4 and FIG. 6C. In this case, as shown in FIG. 6C, a two-layer film made of a CVD $SiO_2$ film and a PSG film, each of a predetermined thickness, are formed on the wafers 24a to 24f while the wafer holder 21 makes a round of the rotary shaft 27. In FIG. 6C, symbol A represents a predetermined thickness of the CVD $SiO_2$ film formed on the wafers 24a to 24f and B represents a predetermined thickness of the PSG film.

First, the first wafer 24a is transferred underneath the susceptor 22a located at the loading/unloading position 33 from a cassette station (not-illustrated) by a robot.

Then, the first wafer 24a is positioned on the wafer mounting surface 23a of the susceptor 22a, air is exhausted through the exhaust port/gas introduction port 25a, and a solenoid valve (not-illustrated) is opened to secure the first wafer 24a to the wafer mounting surface 23a by suction. Then, electric power is supplied to all of heaters 28a to 28f to heat all susceptors 22a to 22f and to keep the temperature of all wafer mounting surfaces 23a to 23f at approx. 350° C.

Then, after the temperature of the first wafer 24a reaches approx. 350° C., the rotary shaft 27 is rotated counterclockwise and the rotation is stopped when the susceptor 22a comes to a position just above the gas discharger 31a. In this case, because the moving time is as short as approx. 0.8 sec and the susceptor 22a has a large heat capacity, the temperature of the first wafer 24a hardly lowers during the moving period.

Then, a gaseous mixture of TEOS and $O_3$ is emitted from the gas discharger as a reaction gas. In this case, the deposition thickness of th $SiO_2$ film comes to approx. 2,000 Å. After approx. 1 min, an $SiO_2$ film with a thickness of approx. 2,000 Å, which is approx. ½ the predetermined thickness, is formed on the first wafer 24a. While the film is formed, the reaction gas is uniformly supplied onto the first wafer 24a because the susceptor 22a undergoes linear reciprocative motion, driven by a oscillation unit (not-illustrated), in the radial direction around the position where it is held. The thickness of the formed $SiO_2$ film is thereby uniform and the film quality is improved.

During the above period, the second wafer 24b is mounted on the susceptor 22b located at the loading/unloading station 33 and the temperature of the second wafer 24b is kept at approx. 350° C., as described above.

Then, the rotary shaft 27 is rotated and the rotation is stopped when the susceptors 22b and 22a come to positions just above the gas dischargers 31a and 31b respectively. In this case, it is possible to immediately start forming a film because the temperature of the second wafer 24b already is approx. 350° C. Therefore, the TEOS-$O_3$ gas mixture is immediately discharged from the gas dischargers 31a and 31b as a reaction gas. When this state is kept for approx. 1 min, an $SiO_2$ film with thickness of approx. 4,000 Å, which is the predetermined thickness, is formed on the first wafer 24a and an $SiO_2$ film with a thickness of approx. 2,000 Å, which is approx. ½ the predetermined thickness, is formed on the second wafer 24b.

During the above period, the third wafer 24c is mounted on the susceptor 22c located at the loading/unloading portion 33a and the temperature of the third wafer 24c is kept at approx. 350° C., as described above.

Then, the rotary shaft 27 is rotated and the rotation is stopped when the susceptors 22c, 22b, and 22a come to positions just above the gas dischargers 31a, 31b, and 31c respectively. At this time, it is possible to immediately start forming a film because the temperature of the third wafer 24c is already approx. 350° C. Therefore, a gas mixture of TEOS-$O_3$ and TMPO is immediately discharged from the gas dischargers 31a, 31b, and 31c as a reaction gas. When this state is kept for approx. 1 min, a PSG film with a thickness of approx. 2,000 Å, which is approx. ⅓ the predetermined thickness, is formed on the first wafer 24a, an $SiO_2$ film with a thickness of approx. 4,000 Å, which is the predetermined thickness, is formed on the second wafer 24b, and moreover, an $SiO_2$ film with a thickness of 2,000 Å, which is approx. ½ the predetermined thickness, is formed on the third wafer 24c.

Thus, wafers are set to the susceptors 22d to 22f and one by one coated with a two-layer insulating film, i.e. an $SiO_2$ film and a PSG film on each wafer. When the first wafer 24a completes a round of the rotary shaft 27 and returns to the loading/unloading portion 33, the $SiO_2$ film and the PSG film with the predetermined thicknesses are formed on the first wafer 24a. During the above period, the wafer temperature for forming a film is very stable.

When a robot is moved to the loading/unloading position 33, a solenoid valve for operating the vacuum chuck of the susceptor 22a is closed, and a nitrogen-introduction valve (not-illustrated) is opened to supply nitrogen gas to the vacuum chuck, the first wafer 24a is held by the robot and detached from the wafer mounting surface 23a. Then, the first wafer 24a is transferred to a cooling chamber at the cassette station by the robot. The first wafer 24a transferred to the cooling chamber is air-cooled by blowing nitrogen gas on it and housed in a wafer cassette. Thus, a $SiO_2$ film and a PSG film, each of a predetermined thickness, are successively formed on wafers and the wafers are accumulated in the wafer cassette.

As described above, the method for forming a $SiO_2$ film using the CVD apparatus of the present invention makes it possible to keep a high throughput because the loading/unloading time is not added as such.

Moreover, by separating the susceptors 22a to 22f and the dischargers 31a to 31e from each other, it is possible to accurately control the production of each wafer.

Furthermore, because each of the susceptors 22a to 22f undergoes linear reciprocative motion in the radial direction, a reaction gas is uniformly supplied to wafers.

Though the heaters 28a to 28f are separated from the wafer holder 21 and wafers are periodically moved away from the heaters 28a to 28f, the wafer temperature hardly fluctuates because the wafer mounting table 47 has a large heat capacity and completes movement in a short time. It is thereby possible to form a film with a uniform thickness and a high quality on the wafers.

Formation of a two-layer insulating film by using two types of reaction gases is described above; however, as shown in FIG. 6A, it is also possible to form a single film on the wafer 241, while the wafer 241 is turned through one rotation, by supplying one type of gas to the gas dischargers 31a to 31e.

Figure 6B:
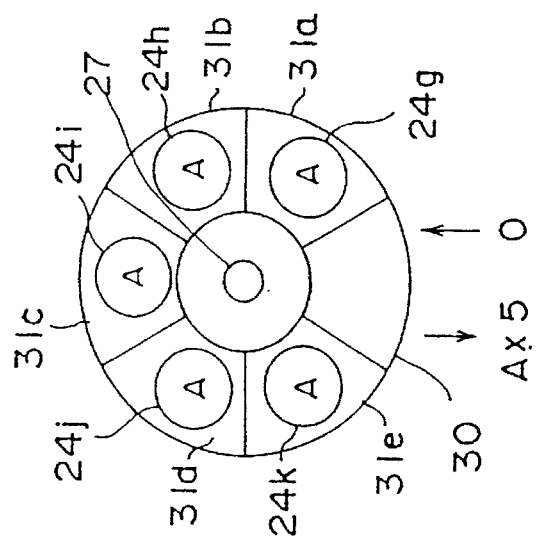
Figure 6A:
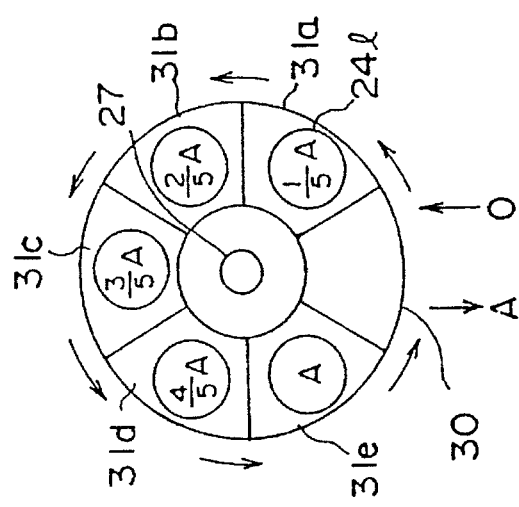

Moreover, as shown in FIG. 6B, it is possible to form a single film by a method similar to the batch system by first setting wafers 24g to 24k on all the susceptors 22a to 22f and thereafter forming a film on the wafers 24g to 24k using one type of reaction gas.

What is claimed is:

1. An apparatus for forming a film on a wafer substrate comprising:

a rotary shaft;

a gas distributor, for discharging a reaction gas, including a plurality of gas dischargers arranged in a circle around said rotary shaft;

a wafer holder mounted on said rotary shaft for rotation relative to said gas distributor and including a plurality of wafer mounting surfaces arranged in a circle around said rotary shaft, said wafer mounting surfaces facing said gas dischargers;

vertical positioning means for moving either said gas distributor or said wafer holder between a first position where said wafer holder and said gas distributor are in a spaced, facing relationship for discharge of the reaction gas onto a wafer substrate and a second position where said wafer holder and said gas distributor are spaced further apart than in said first position;

cleaning means for cleaning said gas dischargers; and horizontal positioning means for moving said cleaning means between a standby position, located radially intermediate (1) said wafer mounting surfaces and said gas dischargers and (2) said rotary shaft, said standby position being occupied by said cleaning means when said wafer holder and said gas distributor are in said first position, and a working position vertically intermediate one gas discharger and a wafer mounting surface where said cleaning means is in contact with said one gas discharger, said working position being occupied by said cleaning means when said wafer holder and said gas distributor are in said second position.

2. The apparatus for forming a film according to claim 1, wherein said horizontal positioning means is rotated by said rotary shaft.

3. The apparatus for forming a film according to claim 1, wherein said horizontal positioning means comprises a shaft for pivoting said cleaning means between said standby and working positions.

4. The apparatus for forming a film according to claim 1, wherein said rotary shaft serves as said vertical positioning means, said rotary shaft being axially reciprocal to move said wafer holder between said first and second positions.

5. An apparatus for forming a film on a wafer substrate comprising:

a rotary shaft;

a gas distributor, for discharging a reaction gas, including a plurality of gas dischargers arranged in a circle around said rotary shaft;

a wafer holder mounted on said rotary shaft for rotation relative to said gas distributor and including a plurality of wafer mounting surfaces arranged in a circle around said rotary shaft, said wafer mounting surfaces facing said gas dischargers;

vertical positioning means for moving either said gas distributor or said wafer holder between a first position where said wafer holder and said gas distributor are in a spaced, facing relationship for discharge of the reaction gas onto a wafer substrate and a second position where said wafer holder and said gas distributor are spaced further apart than in said first position;

cleaning means for cleaning said gas dischargers; and horizontal positioning means for moving said cleaning means between a standby position, located radially intermediate (1) said wafer mounting surfaces and said gas dischargers and (2) said rotary shaft, said standby position being and occupied by said cleaning means when said wafer holder and said gas distributor are in said first position, and a working position vertically intermediate one gas discharger and a wafer mounting surface where said cleaning means is in contact with said one gas discharger, said working position being occupied by said cleaning means when said wafer holder and said gas distributor are in said second position.

6. The apparatus for forming a film according to claim 5, wherein said horizontal positioning means is rotated by said rotary shaft.

7. The apparatus for forming a film according to claim 5, wherein said horizontal positioning means comprises a shaft for pivoting said cleaning means between said standby and working positions.

8. The apparatus for forming a film according to claim 5, wherein said rotary shaft serves as said vertical positioning means, said rotary shaft being axially reciprocal to move said gas distributor between said first and second positions.

\* \* \* \* \*